United States Patent
Kim et al.

(10) Patent No.: US 8,017,477 B2
(45) Date of Patent: *Sep. 13, 2011

(54) NONVOLATILE MEMORY DEVICES AND METHODS OF FABRICATING THE SAME

(75) Inventors: Won-joo Kim, Yongin-si (KR); Suk-pil Kim, Yongin-si (KR); Yoon-dong Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1252 days.

This patent is subject to a terminal disclaimer.

(21) Appl. No.: 11/704,205

(22) Filed: Feb. 9, 2007

(65) Prior Publication Data

US 2008/0025096 A1 Jan. 31, 2008

(30) Foreign Application Priority Data

Jul. 28, 2006 (KR) .................. 10-2006-0071570

(51) Int. Cl.
*H01L 21/336* (2006.01)

(52) U.S. Cl. ........ 438/257; 438/258; 438/259; 438/260; 438/261; 438/262; 438/263; 438/264; 438/265; 438/266; 438/267

(58) Field of Classification Search .......... 257/314–320, 257/E21.68; 438/257–267
See application file for complete search history.

(56) References Cited

U.S. PATENT DOCUMENTS

| 5,179,427 | A | 1/1993 | Nakayama et al. |
| 6,475,872 | B1 | 11/2002 | Jung |
| 6,627,943 | B2 | 9/2003 | Shin et al. |
| 6,936,887 | B2 | 8/2005 | Harari et al. |
| 7,196,370 | B2 | 3/2007 | Kai et al. |
| 7,491,998 | B2 | 2/2009 | Chang et al. |
| 7,550,393 | B2 | 6/2009 | Jeong |

(Continued)

FOREIGN PATENT DOCUMENTS

JP 1994-208796 7/1994

OTHER PUBLICATIONS

Chinese Office Action dated Jun. 6, 2008 issued in corresponding Chinese Application No. 2005101068619 and English translation thereof.

(Continued)

*Primary Examiner* — Lynne Gurley
*Assistant Examiner* — Samuel Gebremariam
(74) *Attorney, Agent, or Firm* — Harness, Dickey & Pierce, P.L.C.

(57) ABSTRACT

A nonvolatile memory device includes a plurality of first control gate electrodes, second control gate electrodes, first storage node films, and second storage node films. The first control gate electrodes are recessed into a semiconductor substrate. Each second control gate electrode is disposed between two adjacent first control gate electrodes. The second control gate electrodes are disposed on the semiconductor substrate over the first control gate electrodes. The first storage node films are disposed between the semiconductor substrate and the first control gate electrodes. The second storage node films are disposed between the semiconductor substrate and the second control gate electrodes. A method of fabricating the nonvolatile memory device includes forming the first storage node films, forming the first control gate electrodes, forming the second storage node films, and forming the second control gate electrodes.

23 Claims, 6 Drawing Sheets

U.S. PATENT DOCUMENTS

| | | |
|---|---|---|
| 7,579,247 B2 | 8/2009 | Harari et al. |
| 7,679,960 B2 * | 3/2010 | Hyun et al. ............... 365/185.18 |
| 7,750,393 B2 * | 7/2010 | Kim et al. ..................... 257/316 |
| 2004/0080991 A1 | 4/2004 | Sawasaki |
| 2005/0253185 A1 | 11/2005 | Smith |
| 2006/0197111 A1 | 9/2006 | Matsuzawa |
| 2006/0278913 A1 | 12/2006 | Mihnea et al. |
| 2008/0023749 A1 * | 1/2008 | Kim et al. ..................... 257/316 |
| 2008/0025096 A1 | 1/2008 | Kim et al. |
| 2008/0175061 A1 * | 7/2008 | Kim et al. ................ 365/185.18 |
| 2008/0191264 A1 | 8/2008 | Kim et al. |

OTHER PUBLICATIONS

European Search Report dated Apr. 4, 2008 issued in corresponding European Application No. 07122917.3.

Office Action dated Jun. 17, 2010 issued in related U.S. Appl. No. 11/724,290.

Office Action dated Dec. 6, 2010 issued in related U.S. Appl. No. 11/724,290.

* cited by examiner

NONVOLATILE MEMORY DEVICES AND METHODS OF FABRICATING THE SAME

PRIORITY STATEMENT

This application claims priority from Korean Patent Application No. 10-2006-0071570, filed on Jul. 28, 2006, in the Korean Intellectual Property Office (KIPO), the entire contents of which are incorporated herein by reference.

BACKGROUND

1. Field

Example embodiments relate to semiconductor memory devices and methods of fabricating the semiconductor memory devices. Also, example embodiments relate to semiconductor memory devices including recess-type gate electrodes and methods of fabricating the semiconductor memory devices including recess-type gate electrodes.

2. Description of Related Art

With recent development in increasing a speed and miniaturization of semiconductor products, such semiconductor products require more high-integrated and high-speed semiconductor memory devices. Accordingly, instead of related art planar structures, memory devices having three-dimensional structures are being introduced. For example, a semiconductor memory device with a three-dimensional structure has a recess-type control gate electrode extended into a semiconductor substrate.

Such a nonvolatile memory device with a three-dimensional structure has a wide channel region and accordingly has a high operating speed, compared to the related art planar structures. However, the increase in integration of a semiconductor memory with a three-dimensional structure has a limitation. This is because impurity doping regions such as source and drain regions still occupy wide portions in a semiconductor memory device with a three-dimensional structure. Particularly, in a "not and" (NAND) structure semiconductor memory having excellent integration, source regions and drain regions which are positioned alternately has a wide region, which hinders increase of integration.

SUMMARY

Example embodiments may provide nonvolatile memory devices allowing higher integration.

Example embodiments also may provide methods of fabricating the nonvolatile memory devices.

According to example embodiments, nonvolatile memory devices may include a plurality of first control gate electrodes. Each first control gate electrode may be formed so as to be recessed into a semiconductor substrate. A plurality of second control gate electrodes may be formed in such a manner that each second control gate electrode may be disposed between two adjacent parts of the plurality of first control gate electrodes. The plurality of second control gate electrodes may be formed on the semiconductor substrate, over the plurality of first control gate electrodes. A plurality of first storage node films may be disposed between the semiconductor substrate and the plurality of first control gate electrodes, respectively. A plurality of second storage node films may be disposed between the semiconductor substrate and the plurality of second control gate electrodes, respectively.

The first control gate electrodes and the second control gate electrodes may be disposed in one or more NAND structures.

The nonvolatile memory device further may include a plurality of first channel regions surrounding the first control gate electrodes that may be formed near the surface of the semiconductor substrate; and/or a plurality of second channel regions that may be formed near the surface of the semiconductor substrate, below the second control gate electrodes. One or more of the first channel regions may be electrically connected to one or more of the second channel regions.

The nonvolatile memory device further includes a device isolation layer formed on the semiconductor substrate, so that active regions of the semiconductor substrate are defined to be extended across the plurality of first control gate electrodes and the plurality of second control gate electrodes.

According to example embodiments, methods of fabricating nonvolatile memory devices may include: forming a plurality of storage node films to be recessed into a semiconductor substrate; forming a plurality of first control gate electrodes to be recessed into the semiconductor substrate, on the plurality of first storage node films; forming a plurality of second storage node films on the semiconductor substrate, each second storage node film disposed between adjacent two of the plurality of first control gate electrodes; and/or forming a plurality of second control gate electrodes on the plurality of second storage node film, over the plurality of first control gate electrodes.

The methods of fabricating nonvolatile memory devices may further include, before forming the plurality of first storage node films, forming a device isolation layer on the semiconductor substrate so as to define active regions of the semiconductor substrate extended across the plurality of first control gate electrodes and/or the plurality of second control gate electrodes.

BRIEF DESCRIPTION OF THE DRAWINGS

The above and/or other aspects and advantages will become more apparent and more readily appreciated from the following detailed description of example embodiments taken in conjunction with the accompanying drawings, in which.

DETAILED DESCRIPTION OF EXAMPLE EMBODIMENTS

Figure 1:
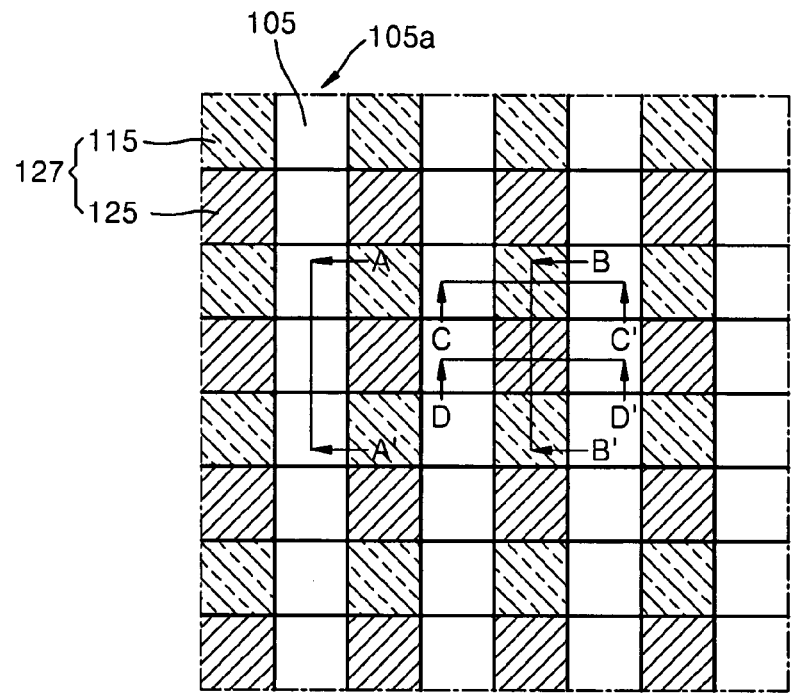
FIGS. 1, 3, and 5 are views for explaining nonvolatile memory devices and methods of fabricating the nonvolatile memory devices, according to example embodiments.
Figure 2A:
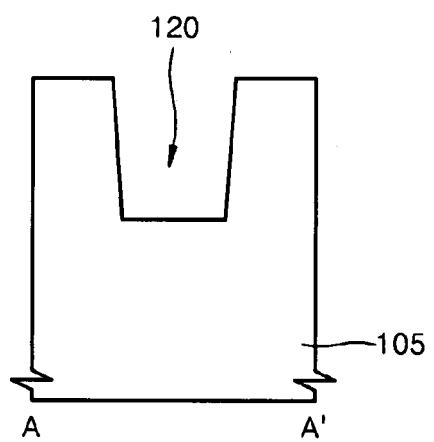
FIGS. 2A, 4A, and 6A are sectional views along lines A-A' of the nonvolatile memory devices illustrated in FIGS. 1, 3, and 5, respectively.
Figure 2B:
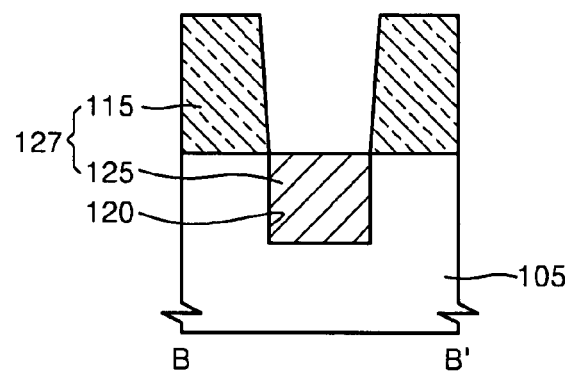
FIGS. 2B, 4B, and 6B are sectional views along lines B-B' of the nonvolatile memory devices illustrated in FIGS. 1, 3, and 5, respectively.
Figure 2C:
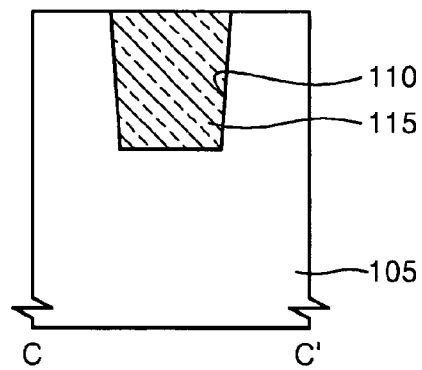
FIGS. 2C, 4C, and 6C are sectional views along lines C-C' of the nonvolatile memory devices illustrated in FIGS. 1, 3, and 5, respectively.
Figure 2D:
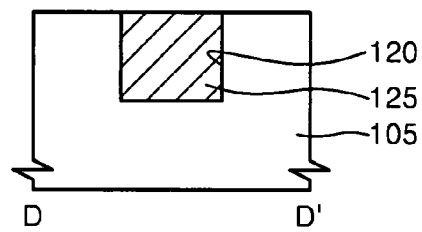
FIGS. 2D, 4D, and 6D are sectional views along lines D-D' of the nonvolatile memory devices illustrated in FIGS. 1, 3, and 5, respectively.

Example embodiments will now be described more fully with reference to the accompanying drawings. Embodiments may, however, be embodied in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to," or "coupled to" another component, it may be directly on, connected to, or coupled to the other component or intervening components may be present. In contrast, when a component is referred to as being "directly on," "directly connected to," or "directly coupled to" another component, there are no intervening components present. As used herein, the term "and/or" includes any and all combinations of one or more of the associated listed items.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the example embodiments.

Spatially relative terms, such as "beneath," "below," "lower," "above," "upper," and the like may be used herein for ease of description to describe one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to the like components throughout.

Nonvolatile memory devices according to example embodiments may include electrically erasable programmable read-only memories (EEPROMs) and/or flash memory devices. The flash memory devices may include silicon oxide nitride oxide silicon (SONOS) memory devices.

Figure 3:
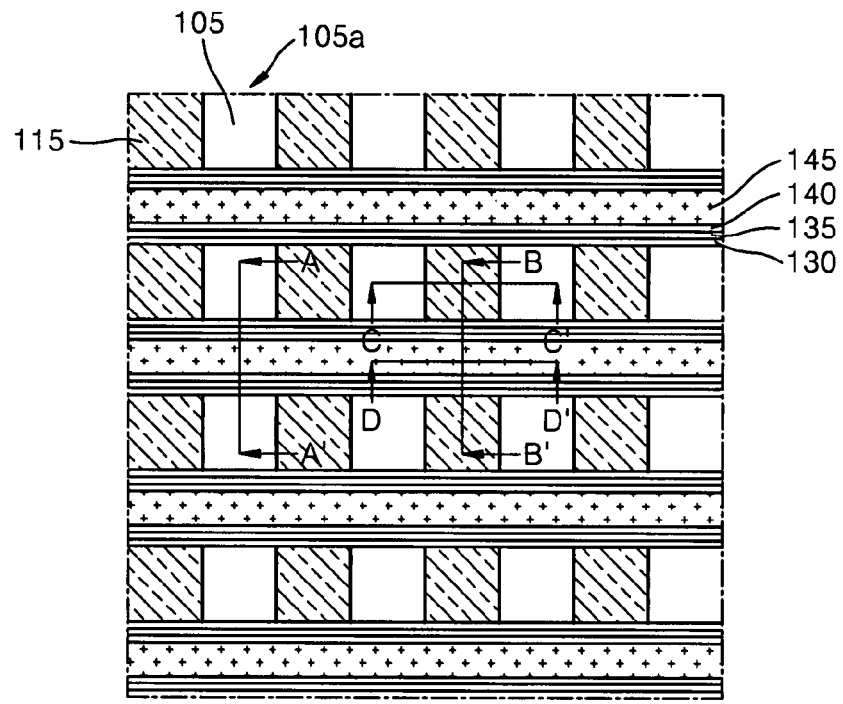
Figure 4A:
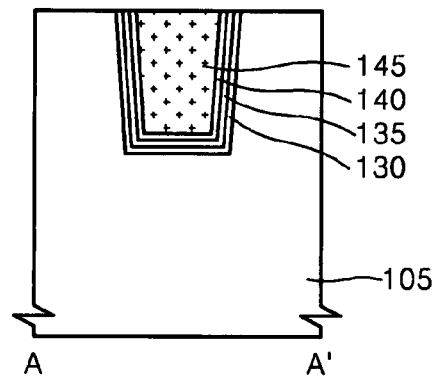
Figure 4B:
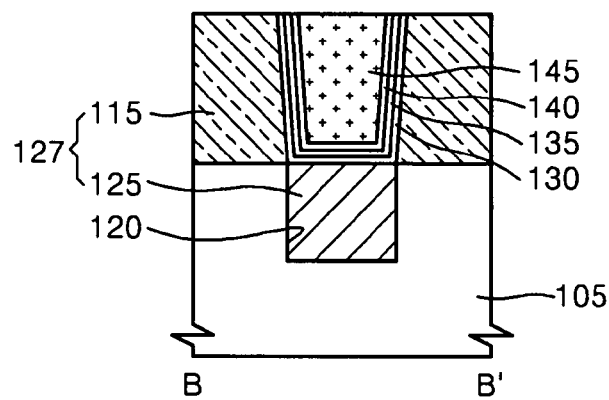
Figure 4C:
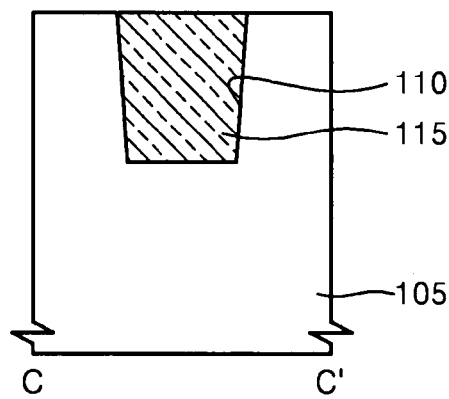
Figure 4D:
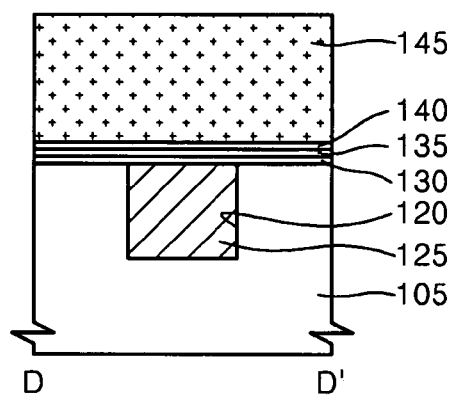
Figure 5:
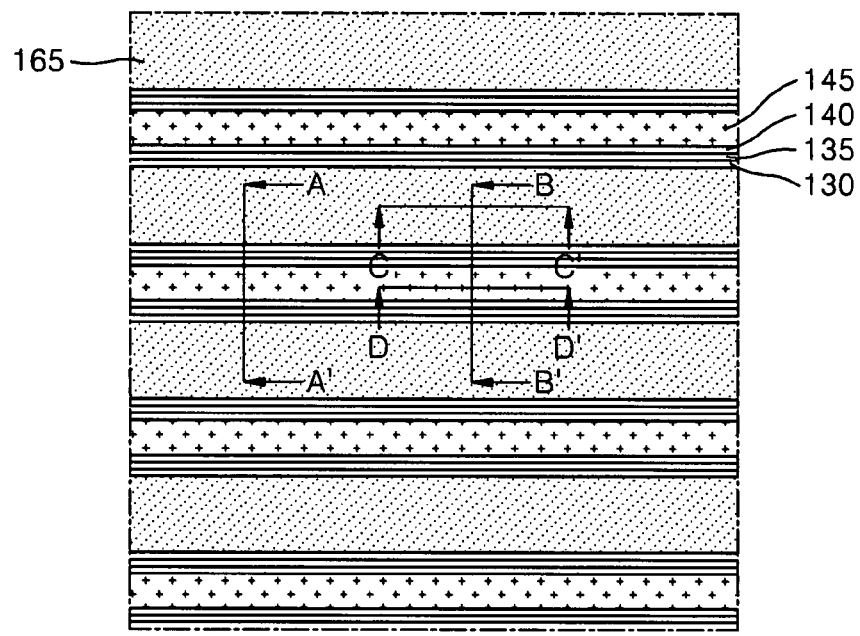

FIGS. 1, 3, and 5 are views for explaining nonvolatile memory devices and methods of fabricating the nonvolatile memory devices, according to example embodiments. Hereinafter, referring to FIGS. 5 and 6A through 6D, a nonvolatile memory device according to an example embodiment will be described. The nonvolatile memory device may include a plurality of first control gate electrodes 145 and/or a plurality of second control gate electrodes 165.

A plurality of first storage node films 135 may be disposed between the plurality of first control gate electrodes 145 and a semiconductor substrate 105, respectively. A plurality of second storage node films 155 may be disposed between the plurality of second control gate electrodes 165 and the semiconductor substrate 105, respectively. The first control gate electrodes 145 and the second control gate electrodes 165 may be alternately arranged. For example, the second control gate electrodes 165 may be respectively disposed between two adjacent first control gate electrodes 145. The number of the first control gate electrodes 145 and/or the number of the second control gate electrodes 165 shown in the example embodiment is for illustration purposes only. The number of the first control gate electrodes 145 and/or the number of the second control gate electrodes 165 may be more than, the same as, or less than shown. The number of the first control gate electrodes 145 may be greater than, equal to, or less than the number of the second control gate electrodes 165.

For example, the first control gate electrodes 145 may be recessed into the semiconductor substrate 105 and/or the second control gate electrodes 165 may be formed on the semiconductor substrate 105. The first control gate electrodes 145 and/or the second control gate electrodes 165 may be formed, for example, with step heights on the semiconductor substrate 105. One or more of the first control gate electrodes 145 may be called, for example, "recess type" control gate electrodes or "trench type" control gate electrodes, and one or more of the second control gate electrodes 165 may be called, for example, "planar type" control gate electrodes. Of course, one or more of the first control gate electrodes 145 may not be "recess type" or "trench type" control gate electrodes. Similarly, one or more of the second control gate electrodes 165 may not be "planar type" control gate electrodes.

In the nonvolatile memory device according to an example embodiment, the first control gate electrodes 145 and/or the second control gate electrodes 165 may be used as word lines. By controlling the first control gate electrodes 145 and/or the second control gate electrodes 165, data may be programmed and/or erased, to and/or from, the first storage node films 135 and/or the second storage node films 155. A part of the semiconductor substrate 105 may be used, for example, as bit lines. In an example embodiment, the first control gate electrodes 145 and the second control gate electrodes 165 may be alternately arranged, thereby forming a NAND structure.

Example embodiments of the semiconductor substrate 105 may include bulk semiconductor wafer (i.e., a silicon wafer, a germanium wafer, and/or a silicon-germanium wafer). In addition or in the alternative, the semiconductor substrate 105 may include a semiconductor epitaxial layer on a bulk semiconductor wafer. The first storage node films 135 and/or the second storage node films 155 may include, for example, a polysilicon layer, a silicon nitride layer, dots made of metal and/or silicon, and/or nano-crystal made of metal or silicon, in order to store charges. The first control gate electrodes 145 and/or the second control gate electrodes 165 may include, for example, a polysilicon layer, a metal layer, and/or a metal silicide layer.

In addition or in the alternative, a plurality of first tunneling insulation films 130 may be respectively disposed between the first storage node films 135 and the semiconductor substrate 105, and/or a plurality of first blocking insulation films 140 may be respectively disposed between the first storage node films 135 and the first control gate electrodes 145. Also, a plurality of second tunneling insulation films 150 may be respectively disposed between the second storage node films 155 and the semiconductor substrate 105, and/or a plurality of second blocking insulation films 160 may be respectively disposed between the second storage node films 155 and the second control gate electrodes 165.

For example, the first tunneling insulation films 130 and/or the second tunneling insulation films 150 may include an insulating film (i.e., an oxide film and/or a nitride film) allowing tunneling of charges. The first blocking insulation films 140 and/or the second blocking insulation films 160 may include a proper insulation film, for example, an oxide film, a nitride film, and/or a film with a high dielectric constant K.

In example embodiments, the second control gate electrodes 165 may be disposed higher than the first control gate electrodes 145, so that the second control gate electrodes 165 may not be electrically connected with the first control gate electrodes 145. A plurality of first channel regions 170 may be respectively defined, for example, near semiconductor substrate regions which surround the first control gate electrodes 145, and a plurality of second channel regions 175 may be respectively defined, for example, near semiconductor substrate regions below the second control gate electrodes 165. When a turn-on voltage is applied to the first control gate electrodes 145 and/or the second control gate electrodes 165, the first channel regions 170 and/or the second channel regions 175 may function as channels allowing current to flow.

Figure 6A:
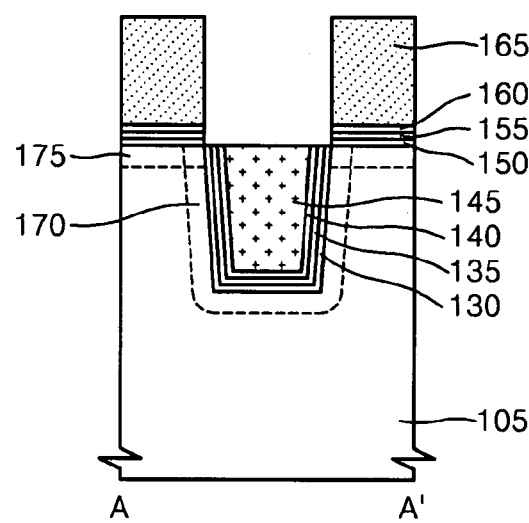
Figure 6B:
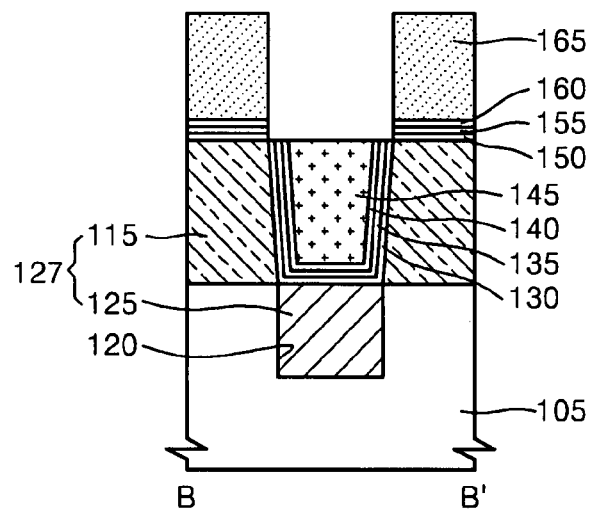
Figure 6C:
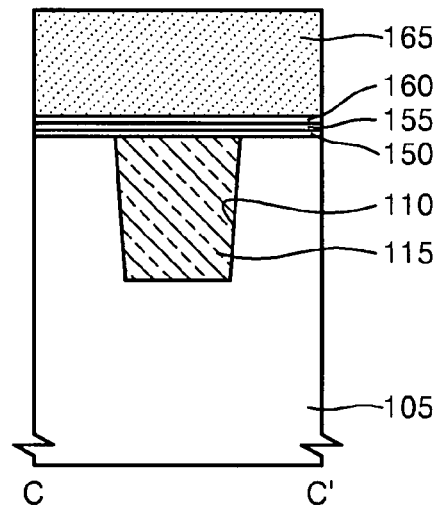
Figure 6D:
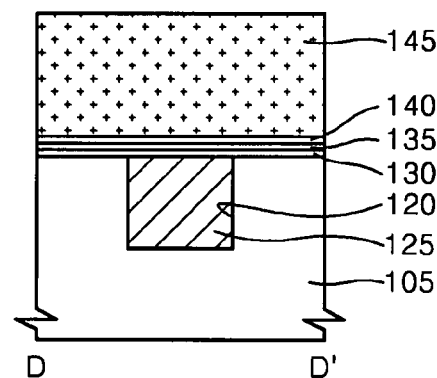

In example embodiments, if the first control gate electrodes 145 and/or the second control gate electrodes 165 may be formed with different heights in such a manner that their edges may be adjacent to each other, the first channel regions 170 may be electrically connected with the second channel regions 175. Further, as illustrated in FIG. 6A, the edges of the first channel regions 170 may overlap the edges of the second channel regions 175. By overlapping of the first channel regions 170 and/or the second channel regions 175, a current may continuously flow, for example, without a separate impurity doping region (i.e., without source regions and/or drain regions).

For example, in a nonvolatile memory device with a NAND structure, it may be unnecessary to form one or more impurity doping regions between the first control gate electrodes 145 and/or the second control gate electrodes 165 that act as word lines. Accordingly, integration of a nonvolatile memory device may be greatly improved compared with related art techniques. If the width of an impurity doping region is similar to the width of one of the first control gate electrodes 145 and/or one of the second control gate electrodes 165, integration of the nonvolatile memory device according to an example embodiment may be double the integration of the related art techniques.

However, in order to further enhance reliability in electrical connections of the first channel regions 170 and/or the second channel regions 175, an impurity doping region (not shown) may be formed, for example, between each first channel region 170 and each second channel region 175. In this case, the impurity doping region may be defined between each first control gate electrode 145 and each second control gate electrode 165 near the surface of the semiconductor substrate 105. Accordingly, in this case, the width of the impurity doping region may be greatly reduced compared to the related art techniques. The impurity doping region may be doped, for example, with a conductive-type material different from the semiconductor substrate.

Also, a plurality of device isolation layers 127 may be formed on the semiconductor substrate 105 in order to define active regions 105a (see FIGS. 1 and 3) on the semiconductor substrate 105. For example, the active regions 105a may extend across the first control gate electrodes 145 and/or the second control gate electrodes 165, and the device isolation layers 127 may surround the active regions 105a. Accordingly, the nonvolatile memory device may have an array structure. Parts in which the device isolation layers 127 may be formed may be called "field regions", corresponding to the active regions 105a.

For example, the device isolation layers 127 may include a plurality of first insulation films 115 and/or a plurality of second insulation films 125. The first insulation films 115 and/or the second insulation films 125 may be disposed, for example, with step heights. The first control gate electrodes 145 and/or the second control gate electrodes 165 may extend onto the device isolation layers 127. For example, the first control gate electrodes 145 may be formed on the second insulation films 125 and/or the second control gate electrodes 165 may be formed on the first insulation films 115. Accordingly, the first control gate electrodes 145 and/or the second control gate electrodes 165 may be formed, for example, on the device isolation layers 127 with the same step height as on the active regions 105a.

However, according to another example embodiment, the first control gate electrodes 145 and/or the second control gate electrodes 165 may be formed on the device isolation layers 127 with a step height different from that on the active regions 105a.

If the nonvolatile memory device is a flash memory device with a NAND structure, selection gate electrodes (not shown) may be further formed on the first control gate electrodes 145 and/or the second control gate electrodes 165 over the semiconductor substrate 105.

Hereinafter, a method of fabricating the nonvolatile memory device will be described.

Referring to FIGS. 1 and 2A through 2D, device isolation layers 127 may be formed on a semiconductor substrate 105 in order to define active regions 105a on the semiconductor substrate 105. In more detail, in order to define the active regions 105a, a plurality of first trenches 110 may be formed in the semiconductor substrate 105. For example, the plurality of first trenches 110 may be formed using photolithography and/or etching. Successively, a plurality of first insulation films 115 may be formed, for example, to fill up the first trenches 110. The first insulation films 115 may be formed using a related art insulation film deposition method, for example, using a chemical vapor deposition (CVD) method and/or a planarization method.

A plurality of second trenches 120 may be formed in the semiconductor substrate 105, across the first trenches 110. When the second trenches 120 may be formed or before the second trenches 120 may be formed, portions of the first insulation films 115 located at intersections of the first trenches 110 and the second trenches 120 may be removed. Accordingly, the depths of the corresponding parts of the second trenches 120 that intersect the first trenches 110 may be deeper, for example, than the depths of the first trenches 110. A plurality of second insulation films 125 may be formed to fill up the depths of the corresponding parts of the second trenches 120 that intersect the first trenches 110. For example, the second insulation films 125 may be formed in a manner to contact the first insulation films 115.

In example embodiments, by the plurality of second trenches 120, step heights or grooves may be formed in the active regions 105a, and by the first insulation films 115 and/or the second insulation films 125, step heights or grooves may be formed in the device isolation layers 127. The parts in which the device isolation layers 127 may be formed may be called "field regions", corresponding to the active regions 105a.

Referring to FIGS. 3 and 4A through 4D, a plurality of first tunneling insulation films 130 may be formed, for example, on the surface region of the semiconductor substrate 105 exposed by the second trenches 120. For example, the first tunneling insulation films 130 may be formed using a thermal oxidation method and/or the CVD method. Successively, a plurality of first storage node films 135 may be formed on the first tunneling insulation films 130. For example, the first storage node films 135 may be formed using the CVD method.

A plurality of first blocking insulation films 140 may be formed on the first storage node films 135. A plurality of first control gate electrodes 145 may be formed on the first blocking insulation films 140 to fill up the second trenches 120. For example, by forming a conductive layer to fill up the second trenches 120 and planarizing the resultant layer, a plurality of first gate electrodes 145 may be formed. Accordingly, the first control gate electrodes 145 may be recessed into the semiconductor substrate 105. In the field regions, the first control gate electrodes 145 may be disposed on the second insulation films 125.

In another example embodiment, the first tunneling insulation films 130 and the first blocking insulation films 140 may have different shapes.

Referring to FIGS. 5 and 6A through 6D, a plurality of second tunneling insulation films 150 may be formed on a portion of the semiconductor substrate regions between the second trenches 120. For example, the second tunneling insulation films 150 may be formed using the thermal oxidation method and/or the CVD method. Successively, a plurality of second storage node films 155 may be formed on the second tunneling insulation films 150. For example, the second storage node films 155 may be formed using the CVD method.

At this point, for example, a plurality of second blocking insulation films 160 may be formed on the second storage node films 155. A plurality of second control gate electrodes 165 may be formed on the second blocking insulation films 160. For example, by forming a conductive layer on the semiconductor substrate 105 and patterning the resultant layer, the second control gate electrodes 165 may be formed. Accordingly, the second control gate electrodes 165 may be respectively formed, for example, with a planar structure between two first control gate electrodes 145. In the field regions, the second control gate electrodes 165 may be disposed on the first insulation films 115.

Because the first control gate electrodes 145 may be respectively disposed with the same or different step heights from the second control gate electrodes 165 in a manner to be adjacent to each other, the plurality of first channel regions 170 and the plurality of second channel regions 175 may be defined so that the first channel regions 170 may be electrically connected with the second channel regions 175 near the surface of the semiconductor substrate 105. Also, in another example embodiment, by performing impurity doping on semiconductor substrate regions exposed between the first control gate electrodes 145 and the second control gate electrodes 165, it may be possible to form impurity doping regions between the first channel regions 170 and the second channel regions 175, respectively.

In another example embodiment, the second tunneling insulation films 150 and the second blocking insulation films 160 may have different shapes.

Finally, a wiring structure may be formed by methods known to those of ordinary skill in the art.

While example embodiments have been particularly shown and described, it will be understood by those of ordinary skill in the art that various changes in form and details may be made therein without departing from the spirit and scope of the present invention as defined by the following claims.

What is claimed is:

1. A nonvolatile memory device, comprising:
    a plurality of first control gate electrodes;
    a plurality of second control gate electrodes;
    a plurality of first storage node films; and
    a plurality of second storage node films;
    wherein the first control gate electrodes are recessed into a semiconductor substrate,
    wherein each second control gate electrode is disposed between two adjacent first control gate electrodes,
    wherein the second control gate electrodes are disposed on the semiconductor substrate over the first control gate electrodes,
    wherein the first storage node films are disposed between the semiconductor substrate and the first control gate electrodes, and
    wherein the second storage node films are disposed between the semiconductor substrate and the second control gate electrodes.

2. The nonvolatile memory device of claim 1, wherein the plurality of first storage node films comprise one or more of a polysilicon layer, a silicon nitride layer, dots made of metal, dots made of silicon, a nano-crystal or nano-crystals made of metal, and a nano-crystal or nano-crystals made of silicon, and wherein the plurality of second storage node films comprise one or more of a polysilicon layer, a silicon nitride layer, dots made of metal, dots made of silicon, a nano-crystal or nano-crystals made of metal, and a nano-crystal or nano-crystals made of silicon.

3. The nonvolatile memory device of claim 1, further comprising:
    a plurality of first tunneling insulation films; and
    a plurality of second tunneling insulation films;
    wherein the first tunneling insulation films are disposed between the first storage node films and the semiconductor substrate, and
    wherein the second tunneling insulation films are disposed between the second storage node films and the semiconductor substrate.

4. The nonvolatile memory device of claim 1, further comprising:
    a plurality first blocking insulation films; and
    a plurality of second blocking insulation films;
    wherein the first blocking insulation films are disposed between the first storage node films and the first control gate electrodes, and
    wherein the second blocking insulation films are disposed between the second storage node films and the second control gate electrodes.

5. The nonvolatile memory device of claim 1, further comprising:
    a plurality of device isolation layers;
    wherein the device isolation layers are disposed on the semiconductor substrate, and
    wherein a plurality of active regions of the semiconductor substrate are defined to extend across the first control gate electrodes and the second control gate electrodes.

6. The nonvolatile memory device of claim 5, wherein the first control gate electrodes extend onto the device isolation layers, and
    wherein the second control gate electrodes extend onto the device isolation layers.

7. The nonvolatile memory device of claim 1, wherein the first control gate electrodes and the second control gate electrodes are disposed in one or more NAND structures.

8. The nonvolatile memory device of claim 7, further comprising:

a plurality of first channel regions; and
a plurality of second channel regions;
wherein at least one of the first channel regions surrounds at least one of the first control gate electrodes,
wherein the first channel regions are disposed near a surface of the semiconductor substrate,
wherein the second channel regions are disposed near the surface of the semiconductor substrate, and
wherein at least one of the second channel regions is disposed below at least one of the second control gate electrodes.

9. The nonvolatile memory device of claim 8, wherein one or more of the first channel regions is electrically connected to one or more of the second channel regions.

10. The nonvolatile memory device of claim 8, wherein edges of the first channel regions overlap edges of the second channel regions.

11. The nonvolatile memory device of claim 8, wherein one or more impurity doping regions is formed between the first and second channel regions.

12. A method of fabricating a nonvolatile memory device, comprising:
forming a plurality of first storage node films, recessed into a semiconductor substrate;
forming a plurality of first control gate electrodes, recessed into the semiconductor substrate, on the first storage node films;
forming a plurality of second storage node films on the semiconductor substrate, each second storage node film disposed between two adjacent first control gate electrodes;
forming a plurality of second control gate electrodes on the second storage node films, over the first control gate electrodes.

13. The method of claim 12, wherein the first control gate electrodes and the second control gate electrodes are formed so that a plurality of first channel regions defined by the first control gate electrodes are electrically connected to a plurality of second channel regions defined by the second control gate electrodes near a surface of the semiconductor substrate.

14. The method of claim 12, further comprising:
forming a plurality of impurity doping regions in a portion of the semiconductor substrate between the first control gate electrodes and the second control gate electrodes.

15. The method of claim 12, wherein the first control gate electrodes and the second control gate electrodes are disposed in one or more NAND structures.

16. The method of claim 12, further comprising:
forming a plurality of device isolation layers on the semiconductor substrate before forming the first storage node films;
wherein the device isolation layers define a plurality of active regions of the semiconductor substrate, and
wherein the active regions extend across the first control gate electrodes and the second control gate electrodes.

17. The method of claim 16, wherein the forming of the plurality of device isolation layers comprises:
forming a plurality of first trenches in the semiconductor substrate, to define the active regions;
forming a plurality of first insulation films to fill the first trenches;
forming a plurality of second trenches in the semiconductor substrate, across the first trenches; and
forming a plurality of second insulation films, to fill corresponding parts of the second trenches that intersect the first trenches by a predetermined depth.

18. The method of claim 17, wherein depths of the corresponding parts of the second trenches that intersect the first trenches are deeper than depths of the first trenches.

19. The method of claim 17, wherein the first storage node films are formed on surface regions of the semiconductor substrate exposed by the second trenches.

20. The method of claim 17, wherein the first control gate electrodes are formed to fill the second trenches.

21. The method of claim 17, further comprising:
forming a plurality of first tunneling insulation films, before forming the first storage node films, on regions of the semiconductor substrate exposed on the second trenches; and
after forming the first storage node films, forming a plurality of first blocking insulation films on the first storage node films;
wherein the first control gate electrodes are formed on the first blocking insulation films.

22. The method of claim 17, wherein the second storage node films and the second control gate electrodes are formed on a portion of the semiconductor substrate between the second trenches.

23. The method of claim 22, further comprising:
forming a plurality of second tunneling insulation films, before forming the second storage node films, on the portion of the semiconductor substrate between the second trenches; and
after forming the second storage node films, forming a plurality of second blocking insulation films on the second storage node films;
wherein the second control gate electrodes are formed on the second blocking insulation films.

* * * * *